United States Patent [19]
Vasquez et al.

[11] Patent Number: 5,175,123
[45] Date of Patent: Dec. 29, 1992

[54] HIGH-PRESSURE POLYSILICON ENCAPSULATED LOCALIZED OXIDATION OF SILICON

[75] Inventors: Barbara Vasquez, Chandler; Michael P. Masquelier, Mesa, both of Ariz.

[73] Assignee: Motorola, Inc., Schaumburg, Ill.

[21] Appl. No.: 612,174

[22] Filed: Nov. 13, 1990

[51] Int. Cl.$^5$ .................. H01L 21/302; H01L 21/76
[52] U.S. Cl. ........................ 437/70; 437/69; 437/67; 437/72; 437/61; 148/DIG. 117
[58] Field of Search ............. 437/69, 67, 70, 72; 148/DIG. 117

[56] References Cited

U.S. PATENT DOCUMENTS

| | | | |
|---|---|---|---|
| 4,459,325 | 7/1984 | Nozawa et al. | 437/70 |
| 4,569,117 | 2/1986 | Baglee et al. | 437/63 |
| 4,581,319 | 4/1986 | Wieder et al. | 437/31 |
| 4,824,794 | 4/1989 | Tabata et al. | 437/33 |
| 4,855,258 | 8/1989 | Allman et al. | 437/69 |
| 4,876,217 | 10/1989 | Zdebel | 437/67 |
| 4,889,825 | 12/1989 | Parrillo | 437/57 |
| 4,927,780 | 5/1990 | Roth et al. | 437/69 |
| 4,931,407 | 6/1990 | Maeda et al. | 437/60 |
| 4,956,307 | 9/1990 | Pollack et al. | 437/62 |

FOREIGN PATENT DOCUMENTS 0194423 11/1984 Japan.
0186551 8/1987 Japan.
0030244 2/1989 Japan.
0035710 2/1990 Japan.

OTHER PUBLICATIONS

Wolf; "Silicon processing for the VLSI era"; vol. 1--process technology; pp. 516-520; 1987.
Ogawa et al; "Rapid thermal annealed ... Si near interfaces"; Mat. Res. Soc. Sym. Proc. vol. 106; 1988; pp. 273-278.

*Primary Examiner*—Brian E. Hearn
*Assistant Examiner*—Trung Dang
*Attorney, Agent, or Firm*—Miriam Jackson

[57] ABSTRACT

A reduction in defects and lateral encroachment is obtained by utilizing a high pressure oxidation in conjunction with an oxidizable layer conformally deposited over an oxidation mask. The use of high pressure oxidation provides for the formation of LOCOS oxide without the formation of defects. Any native oxide present on the substrate surface is removed by using a ramped temperature deposition process to form oxidizable layer and/or a high temperature anneal is performed to remove the native oxide at the substrate surface. In this embodiment, any oxide which can act as a pipe for oxygen diffusion is removed. Therefore, nominal or no lateral encroachment is exhibited.

11 Claims, 3 Drawing Sheets

HIGH-PRESSURE POLYSILICON ENCAPSULATED LOCALIZED OXIDATION OF SILICON

BACKGROUND OF THE INVENTION

This invention relates, in general, to semiconductor structures, and more particularly, to a method of manufacturing isolation structures in semiconductor integrated circuits.

Semiconductor devices on integrated circuits must be electrically isolated from each other. The most common isolation technique is by localized oxidation of silicon (LOCOS). A disadvantage of this technique is that the surface area in which the semiconductor devices are to be fabricated, or active area, is reduced by the lateral encroachment of the isolation oxide formed. The problem of lateral encroachment is well known in the art.

In the LOCOS process a nitride mask is used to prevent oxidation of the active area. A pad oxide layer is formed under the nitride mask to relieve stress. The amount of encroachment is thought to be related to the pad oxide thickness near the edge of the nitride mask. The oxidation under the nitride mask occurs when oxygen diffuses through the pad oxide layer and reacts with the silicon underlying it.

A method of minimizing the lateral encroachment entails reducing the thickness of the pad oxide layer in order to reduce the cross-sectional area available for oxygen diffusion. This vertical scaling is limited by the stress of nitride. As a general rule, the ratio of oxide to nitride thicknesses is maintained at greater than or equal to $\frac{1}{3}$. If the nitride is thinned, for the same pad oxide thickness, lateral encroachment also increases. One approach to reduce the pad oxide thickness without reducing the nitride thickness requires a polysilicon layer to be formed between the nitride layer and the pad oxide in order to relieve the compressive stress in the substrate brought about by reducing the pad oxide thickness. Although a slight reduction of oxide encroachment is achieved, the process is difficult to control and requires an additional step to remove both the nitride and the polysilicon following the oxidation process.

A LOCOS method has been proposed by Roth et al in Pat. No. 4,927,780, entitled "Encapsulation Method for Localized Oxidation of Silicon," which was issued on May 22, 1990, which is hereby incorporated herein by reference. Further improvements will be realized by the present invention, as will be evident from the description which follows.

Other techniques to reduce lateral encroachment have been tried, but fail to provide a method which is cost effective, manufacturable, and results in the production of a defect-free semiconductor structure.

Accordingly, it is an object of the present invention to provide an improved LOCOS process.

Another object of the present invention is to provide an improved LOCOS process having minimized lateral encroachment.

Yet another object of the present invention is to provide an improved LOCOS process with a reduced defect density.

SUMMARY OF THE INVENTION

The above and other objects and advantages are achieved by utilizing a high pressure oxidation in conjunction with an encapsulated oxidation resistant layer overlying a thin buffer layer to form an isolation oxide. The oxidation resistant layer and the buffer layer is encapsulated by a conformally deposited oxidizable material. The buffer layer is preferably slightly undercut so that the oxidizable material is deposited underneath the oxidation resistant layer. The oxidizable material reduces the formation of lateral encroachment because the diffusion of oxygen through the buffer layer at the edges of the oxidation resistant layer is prevented. The use of high pressure, rather than atmospheric pressure, provides for a defect-free LOCOS oxide. In a second embodiment, any native oxide formed under the conformal oxidizable material is minimized. This can be accomplished in two ways. The first way entails utilizing a ramped deposition process to deposit the oxidizable material. A second way entails annealing the substrate after the oxidizable layer is formed to break up any native oxide present on the silicon surface. In the second embodiment, any oxide which can act as a pipe or channel for oxygen diffusion at the edges of the oxidation resistant layer is removed. Therefore, almost no lateral encroachment is exhibited in this structure.

DETAILED DESCRIPTION OF THE INVENTION

Figure 1:
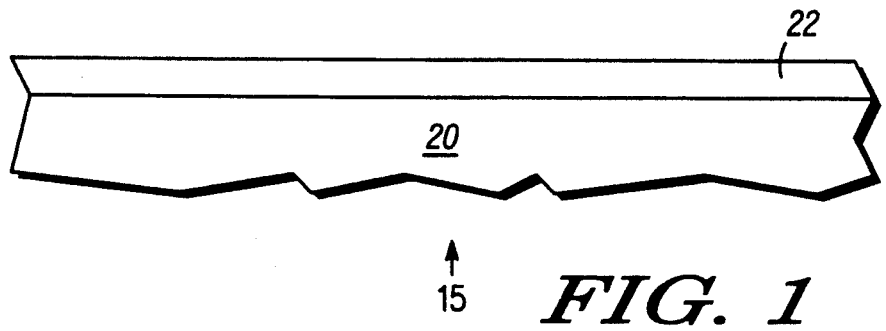
FIGS. 1-7 illustrate enlarged, cross-sectional views of an embodiment of the present invention in various stages of fabrication.

FIGS. 1-7 illustrate enlarged, cross-sectional views of a first embodiment of the present invention during various stages of fabrication. FIG. 1 illustrates a portion 15 of a silicon substrate 20 having a buffer layer 22 formed thereon. Buffer layer 22 is preferably formed by thermally oxidizing substrate 20 until a thickness of approximately 10 to 100 nanometers is obtained. Alternatively, buffer layer 22 may be a silicon dioxide formed by chemical vapor deposition.

Figure 2:
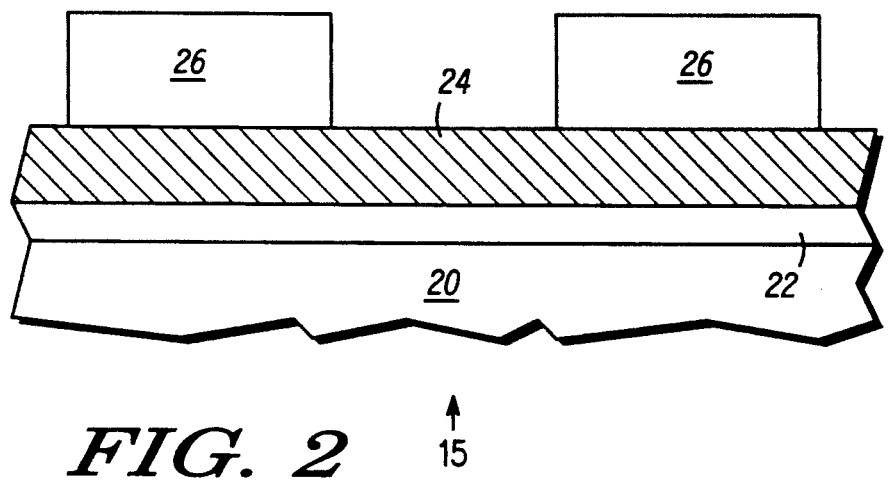

FIG. 2 illustrates the structure of FIG. 1 further along in processing. Following the formation of buffer layer 22, an oxidation resistant layer 24 is formed on buffer layer 22. In accordance with a preferred embodiment, oxidation resistant layer 24 is comprised of silicon nitride deposited to a minimum thickness sufficient to prevent the diffusion of oxygen therethrough. The thickness of oxidation resistant layer 24 may be in the range of 100 to 250 nanometers, but preferably about 150 nanometers. Alternatively, oxidation resistant layer 24 can be comprised of an oxynitride composite material deposited by chemical vapor deposition. A masking layer 26 is then applied and patterned over oxidation resistant layer 24 using conventional photolithographic methods. Masking layer 26 overlies regions of substrate 20 which are to be protected from the substrate oxidation used to form isolation regions in substrate 20, which is shown in subsequent drawings.

Figure 3:
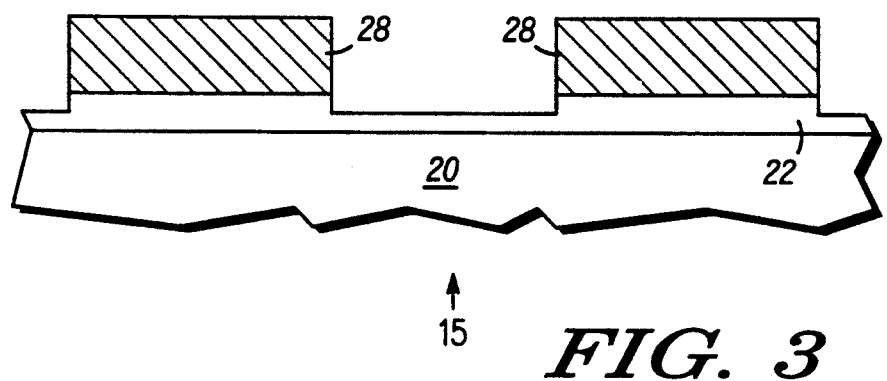

FIG. 3 illustrates the structure of FIG. 2 further along in processing. Oxidation resistant layer 24 is anisotropically etched to form an oxidation mask 28. The anisotropic etch proceeds in the vertical direction faster than in the horizontal direction, thus yielding an oxidation masking structure having straight sidewalls as is illustrated in FIG. 3. The anisotropic etch of the oxidation resistant layer 24 can be non-selective or selective relative to buffer layer 22. With a selective etch, the structure in FIG. 3 results, with all or part of layer 22 remaining. Anisotropic etching may be carried out by plasma or reactive ion etch techniques. A slight over-etch is typically performed, which removes a small portion of buffer layer 22 in areas not protected by masking layer 26. A conventional channel stop implant can be performed at this point in the process. In addition, etching may be carried out to remove all of buffer layer 22 in areas not protected by masking layer 26 (not shown). In this case, the anisotropic etch must be selective to underlying substrate 20. Following the completion of the etch and any ion implantation, masking layer 26 is removed.

Figure 4:
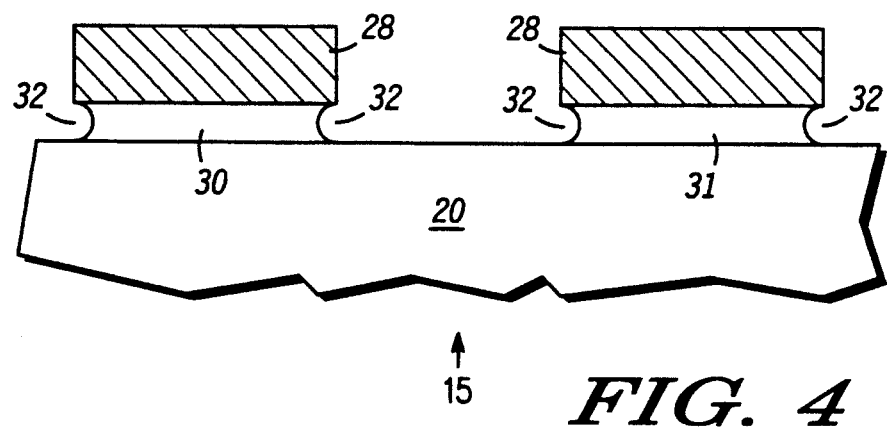

FIG. 4 illustrates the structure of FIG. 3 further along in processing. Buffer layer 22 is etched to form portions 30 and 31 using oxidation mask 28 as an etch mask. An isotropic etch is required, which results in a lateral undercut of buffer layer 22 to form recesses or cavities 32 underlying the periphery of oxidation mask 28. An example of an isotropic etch is a pH-buffered isotropic etch comprising a solution of one part hydrofluoric acid and ten parts ammonium fluoride. Alternatively, unbuffered hydrofluoric acid can be used as an etchant in approximately the same dilution as the buffered etchant with de-ionized water. In addition, a dry isotropic etch can be used if sufficiently selective to oxidation resistant layer 24 and substrate 20.

Figure 5:
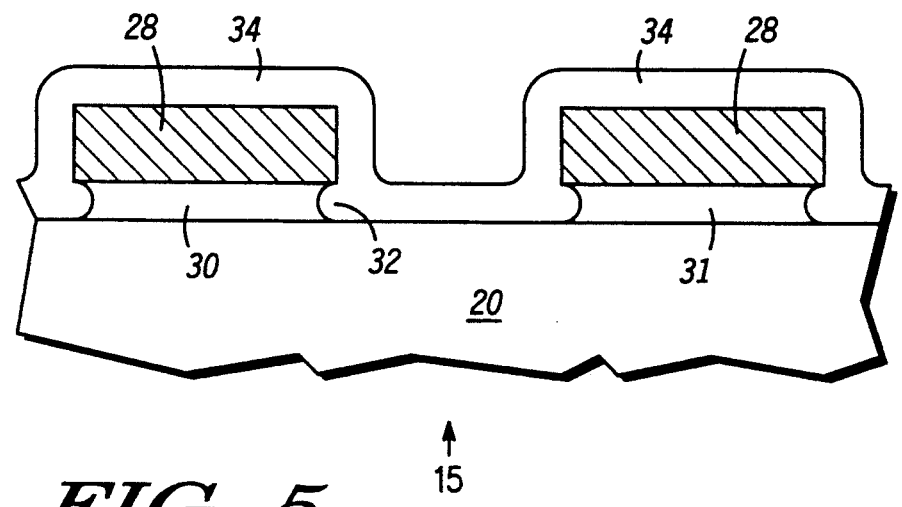

FIG. 5 illustrates the structure of FIG. 4 further along in processing. An oxidizable layer 34 is conformally formed on portion 15 to overlay oxidation mask 28 and exposed portions of substrate 20, as well as substantially filling cavities 32. Oxidizable layer 34 is preferably an amorphous silicon layer having a thickness approximately one half the thickness of buffer layer 22 which defines the height of the cavity to be filled. Alternatively, oxidizable layer 34 may be a chemical vapor deposited polysilicon. Amorphous silicon may be preferable because of the lower diffusivity of oxygen in amorphous silicon would result in less lateral encroachment and the resultant field oxide surface would be smoother. However, it may be more convenient to use polysilicon, because it is more widely used in semiconductor manufacturing. Also, oxidizable layer 34 can be a silicon-rich form of silicon oxide obtained, for example, by low pressure chemical vapor deposition of non-stoichiometric silicon dioxide. In addition, oxidizable layer 34 can be an epitaxial silicon formed by using the exposed regions of substrate 20 to initiate the epitaxial growth.

Figure 6:
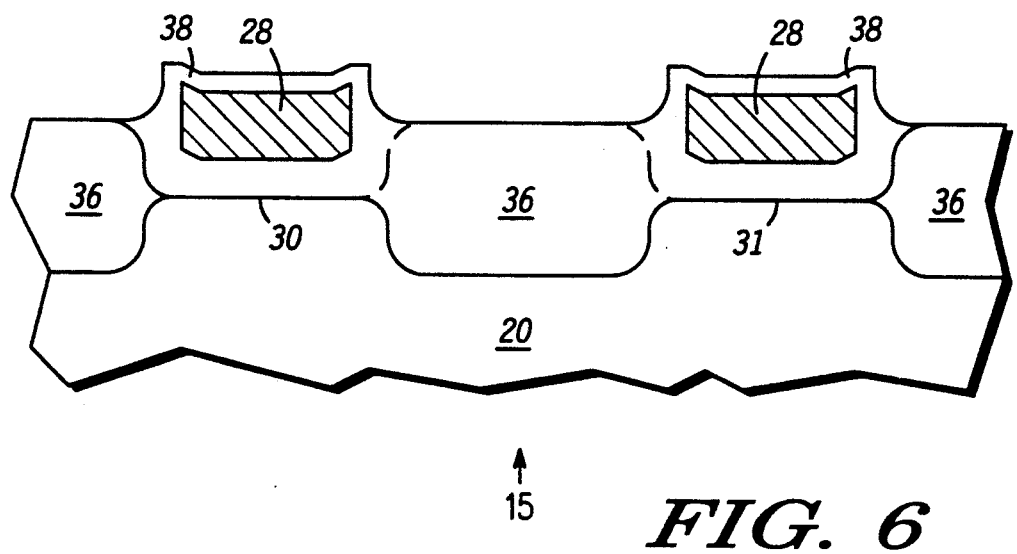

FIG. 6 illustrates the structure of FIG. 5 further along in processing. After oxidizable layer 34 has been formed, a high pressure oxidation is performed to grow a thick isolation oxide 36, as shown in FIG. 6. The interface between isolation oxide 36 and portions 30 and 31 is shown as a dashed line because they are comprised of the same material. High pressure oxidation is carried out at pressures greater than one atmosphere. High pressure oxidation is not commonly used in semiconductor manufacturing due to its high cost. The use of high pressure oxidation, rather than low pressure oxidation, resulted in the formation of a very low defect density formed in substrate 20. It was discovered that the use of high pressure oxidation, in conjunction with oxidizable conformal layer 34 reduces the stress in portion 15 of substrate 20, and thus a defect-free isolation oxide having minimal lateral encroachment is formed.

The field oxidation process, which forms thick isolation oxide 36, consumes oxidizable layer 34, forming a layer of oxidized amorphous silicon or polysilicon 38 overlying oxidation mask 28. The degree of lateral encroachment of isolation oxide 36 under the edge of oxidation mask 28 is minimized as a result of the presence of conformal layer 34. Oxidizable layer 34 reduces the lateral diffusion of oxygen through portions 30 and 31, thus preventing the oxidation of substrate 20 underlying oxidation mask 28.

Figure 7:
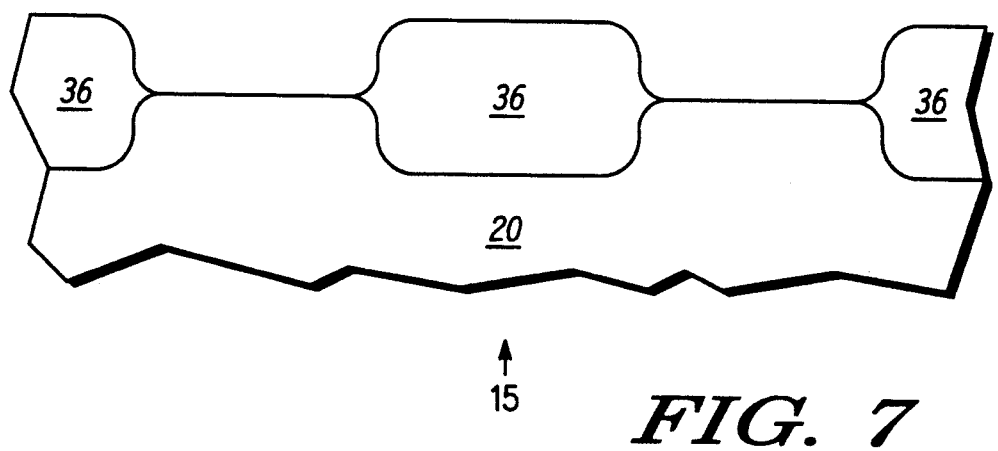

FIG. 7 illustrates the structure of FIG. 6 further along in processing. The isolation process is completed by removing oxidized polysilicon layer 38 and oxidation mask 28 with a wet buffered hydrofluoric acid etch followed by a wet phosphoric acid etch. The reduction of lateral oxide encroachment allows for improved packing density.

The removal of remaining portions 30 and 31 of buffer layer 22 which form cavities 32 is not essential to obtain the improved isolation structure of the present invention. The amount of time buffer layer 22 is isotropically etched must be optimized according to specific etch conditions. These etch conditions may vary from manufacturing site to manufacturing site, thus a specific time of isotropic etch will vary. However, it may be desirable to perform the isotropic etch so that the amount of oxidizable layer 34 deposited in cavities 32 is substantially oxidized upon formation of a desirable thickness of isolation oxide 36. In this manner, no unoxidized oxidizable layer 34 is left remaining, which must be removed from substrate 20 after isolation oxide 36 is formed. However, if some unoxidized oxidizable layer 34 is remaining, it may be removed by an etch highly selective to underlying oxidizable layer 34.

Figure 8:
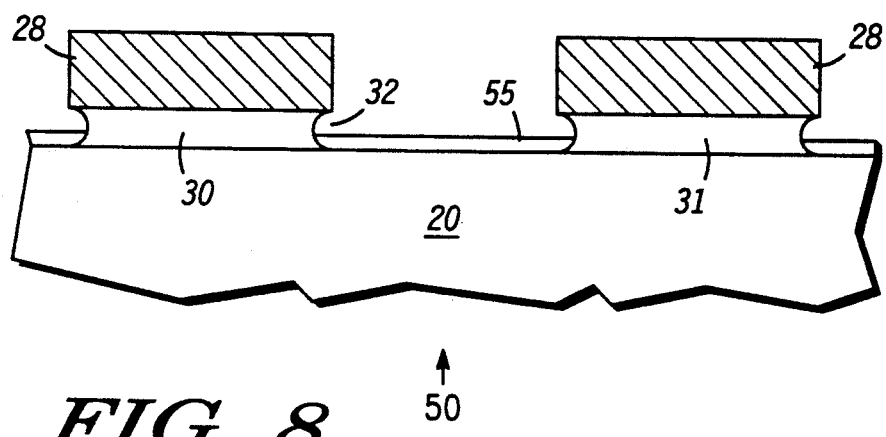
FIGS. 8 and 9 illustrate enlarged, cross-sectional views of a second embodiment of the present invention in various stages of fabrication.
Figure 9:
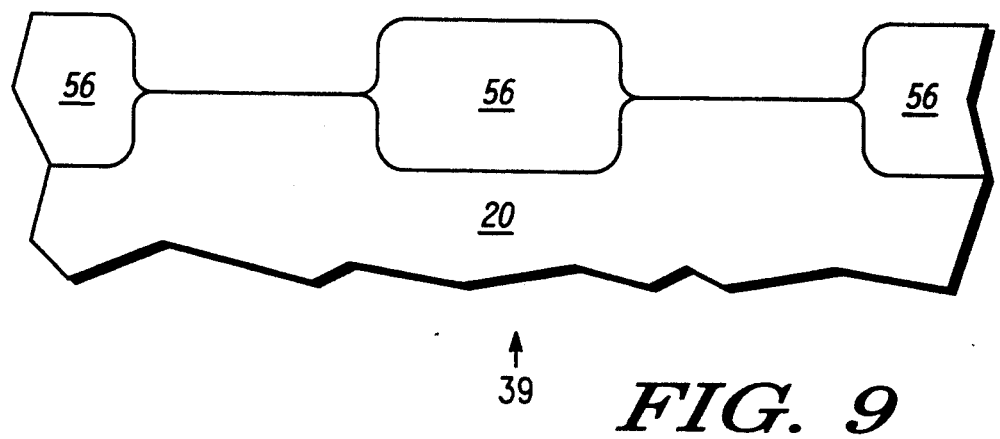

FIGS. 8 and 9 illustrate a second embodiment of the present invention in various stages of fabrication. FIG. 8 illustrates a portion 50 of a semiconductor substrate 20 processed as the structure shown in FIG. 4. After buffer layer 22 has been etched to form portions 30 and 31, a thin native oxide 55 normally grows on exposed substrate 20. This native oxide 55 was not shown in FIG. 5 for convenience Only. In this embodiment, it is desirable to remove native oxide 55.

FIG. 9 illustrates the structure of FIG. 8 further along in processing. The same steps are used to form isolation oxide 56 as the steps described in FIGS. 5 through 7, except that native oxide 55 is kept to a minimum thickness or, more preferably, entirely removed during or after the formation of oxidizable layer 34 shown in FIG. 5. One way of minimizing or preventing the formation of native oxide 55 is to form oxidizable layer using a ramped temperature deposition process. For example, portion 50 is inserted into the deposition chamber at a temperature of approximately 400° C., the temperature is then ramped up and deposition begins at a temperature of approximately 580° to 650° C. A second way of removing or breaking up native oxide 55 is to perform a high temperature anneal after the formation of oxidizable layer 34. This high temperature anneal is typically carried out at temperatures of approximately 1000° to 1150° C., preferably by rapid thermal annealing. The ramped temperature deposition and the subsequent high temperature anneal may also be performed in conjunction with each other. Other processes may be used to minimize the formation of, or remove, native oxide 55 on substrate 20.

During the formation of isolation oxide 56, the presence of oxidizable layer 34 delays oxidation of substrate 20 beneath cavities 32, reducing lateral encroachment, however, it is believed that any oxide 55 underneath oxidizable layer 34 acts as a conduit, or pipe, allowing the diffusion of oxygen therethrough, which causes lateral encroachment. Thus, when the thickness of native oxide 55 is minimized or zero, nominal or no lateral encroachment is formed during the formation of isolation oxide 56, as is illustrated in FIG. 9. The use of high pressure oxidation during the formation of isolation oxide 56 is not essential in this embodiment, however, the use of high pressure oxidation will preferably result in the formation of a defect-free isolation oxide 56.

Alternatively, it may be desirable to intentionally grow a predetermined thickness of an oxide on substrate 20 prior to the formation of oxidizable layer 34 shown in FIG. 5. This embodiment may also be described using FIG. 8. Except in this embodiment, layer 55 is either an oxide which is regrown after the native oxide has been removed, or more oxide is grown on the native oxide. It is desirable to obtain a predetermined thickness of oxide 55 in order to engineer, or form a predetermined amount of, the lateral encroachment of isolation oxide 56. Usually reduced lateral encroachment is preferable, however, is it also advantageous to be able to precisely control the amount of lateral encroachment formed. The presence of oxide 55 is also advantageous for removing some unoxidized oxidizable layer 34 (as described with reference to FIG. 7), if some remains after the formation of isolation oxide 56. An etch which is selective to unoxidized oxidizable layer 34 and not oxide layer 55 can be readily used.

As can be readily seen, an improved method for forming an electrical isolation structure has been provided. The use of high pressure oxidation to form the isolation oxide results in reduced stress and less defects formed in the substrate. The removal of a native oxide prior to deposition of the oxidizable layer results in the formation of no lateral encroachment. One advantage of obtaining no lateral encroachment is that the steeper sidewall angles obtained in the isolation oxide are more favorable for reducing parasitic capacitance for semiconductor junctions abutting the isolation oxide. Another obvious advantage is the improved packing density obtained. By improving device packing density, smaller die sizes can be achieved, and thus higher potential yields and lower die costs may be obtained.

We claim:

1. A method of fabricating isolation oxide, comprising the steps of:
   providing a semiconductor substrate;
   forming a buffer layer on the substrate;
   forming an oxidation resistant layer on the buffer layer;
   removing selected portions of the oxidation resistant layer and the buffer layer to expose portions of the substrate;
   controlling an amount of oxide encroachment by forming an oxide layer on the exposed portions of the substrate and controlling the thickness of the oxide layer;
   conformally forming an oxidizable layer after the step of forming an oxide layer to overlay the oxide layer and the oxidation resistant layer; and
   oxidizing the oxidizable layer and the exposed portions of the substrate to form the isolation oxide in the portions of the substrate covered by the oxide layer, wherein oxidation is performed at high pressure.

2. The method of claim 1 further comprising the step of removing portions of the buffer layer to form a recess under the oxidation resistant layer before the step of conformally forming an oxidiazble layer.

3. The method of claim 1 further comprising the step of anisotropically etching the oxidizable layer to leave a portion of the oxidizable layer bounding the buffer layer and the oxidation resistant layer.

4. The method of claim 1 wherein the oxidation resistant layer is comprised of silicon nitride or oxynitride.

5. The method of claim 1 wherein the step of oxidizing completely consumes the oxidiazble layer converting the oxidizable layer to a silicon dioxide.

6. A method of fabricating isolation oxide, comprising the steps of:
   providing a semiconductor substrate;
   forming a buffer layer on the substrate;
   forming an oxidation resistant layer on the buffer layer;
   removing selected portions of the oxidation resistant layer and the buffer layer to expose portions of the substrate;
   removing portions of the buffer layer to form a recess under the oxidation resistant layer;
   controlling an amount of oxide encroachment by forming an oxide layer on the exposed positions of the substrate and controlling the thickness of the oxide layer;
   conformally forming an oxidizable layer after the step of forming an oxide layer to overlay the oxide layer and the oxidation resistant layer, and to substantially fill the recess in the buffer layer; and
   oxidizing the oxidizable layer and the exposed portions of the substrate to form the isolation oxide in the portions of the substrate covered by the oxide layer, wherein oxidation is performed at high pressure.

7. The method of claim 6 further comprising the step of anisotropically etching the oxidizable layer to leave a portion of the oxidiazble layer bounding the buffer layer and the oxidation resistant layer.

8. The method of claim 6 wherein the oxidation resistant layer is comprised of silicon nitride or oxynitride.

9. The method of claim 6 wherein the step of oxidizing completely consumes the oxidizable layer converting the oxidizable layer to a silicon dioxide.

10. The method of claim 1 wherein the oxidizable layer is comprised of amorphous silicon, polysilicon, or silicon-rich dioxide.

11. The method claim 6 wherein the oxidizable layer is comprised of amorphous silicon, polysilicon, or silicon-rich dioxide.

* * * * *